United States Patent
Kim

(10) Patent No.: US 8,174,040 B2
(45) Date of Patent: May 8, 2012

(54) LIGHT EMITTING DEVICE

(75) Inventor: Sun Kyung Kim, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 405 days.

(21) Appl. No.: 12/514,615

(22) PCT Filed: Jan. 21, 2009

(86) PCT No.: PCT/KR2009/000318
§ 371 (c)(1),
(2), (4) Date: May 13, 2009

(87) PCT Pub. No.: WO2009/093845
PCT Pub. Date: Jul. 30, 2009

(65) Prior Publication Data
US 2010/0314645 A1    Dec. 16, 2010

(30) Foreign Application Priority Data
Jan. 21, 2008 (KR) .................. 10-2008-0006073

(51) Int. Cl.
*H01L 33/60* (2010.01)
(52) U.S. Cl. ............ 257/98; 257/94; 257/E33.013; 257/E33.069; 372/43.01; 372/72
(58) Field of Classification Search ........ 257/98
See application file for complete search history.

(56) References Cited

U.S. PATENT DOCUMENTS

| 5,260,589 | A | 11/1993 | Yamauchi et al. |
| 6,639,250 | B1 | 10/2003 | Shimoda et al. |
| 7,109,651 | B2 * | 9/2006 | Nakamura et al. ............ 313/504 |
| 7,242,026 | B2 | 7/2007 | Fujiwara et al. |
| 7,652,295 | B2 * | 1/2010 | Cho et al. ................. 257/79 |
| 2002/0171087 | A1 | 11/2002 | Krames et al. |
| 2003/0111667 | A1 | 6/2003 | Schubert |
| 2004/0016937 | A1 * | 1/2004 | Kachi et al. .............. 257/98 |
| 2006/0186417 | A1 | 8/2006 | Tsai et al. |
| 2007/0257269 | A1 * | 11/2007 | Cho et al. ................. 257/95 |
| 2008/0142780 | A1 | 6/2008 | Bader et al. |

FOREIGN PATENT DOCUMENTS

| EP | 1 855 327 A2 | 11/2007 |
| JP | 5-37017 A | 2/1993 |
| JP | 2005-51138 A | 2/2005 |
| KR | 10-0690568 B1 | 10/2001 |
| KR | 10-2007-0009673 A | 1/2007 |

* cited by examiner

*Primary Examiner* — Phat X Cao
*Assistant Examiner* — Abul Kalam
(74) *Attorney, Agent, or Firm* — Birch, Stewart, Kolasch & Birch, LLP

(57) ABSTRACT

A light emitting device is provided. The light emitting device comprises: a reflective layer; and a semiconductor layer including a light emitting layer on the reflective layer. A distance between the reflective layer and a center of the light emitting layer corresponds to a constructive interference condition.

19 Claims, 7 Drawing Sheets

【Figure 1】
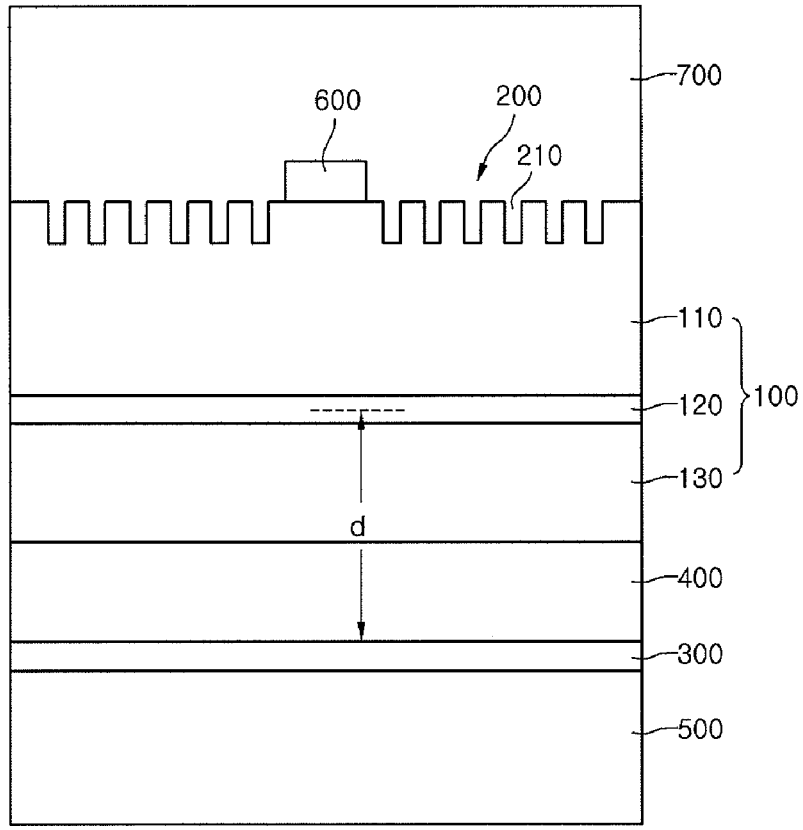
【Figure 2】
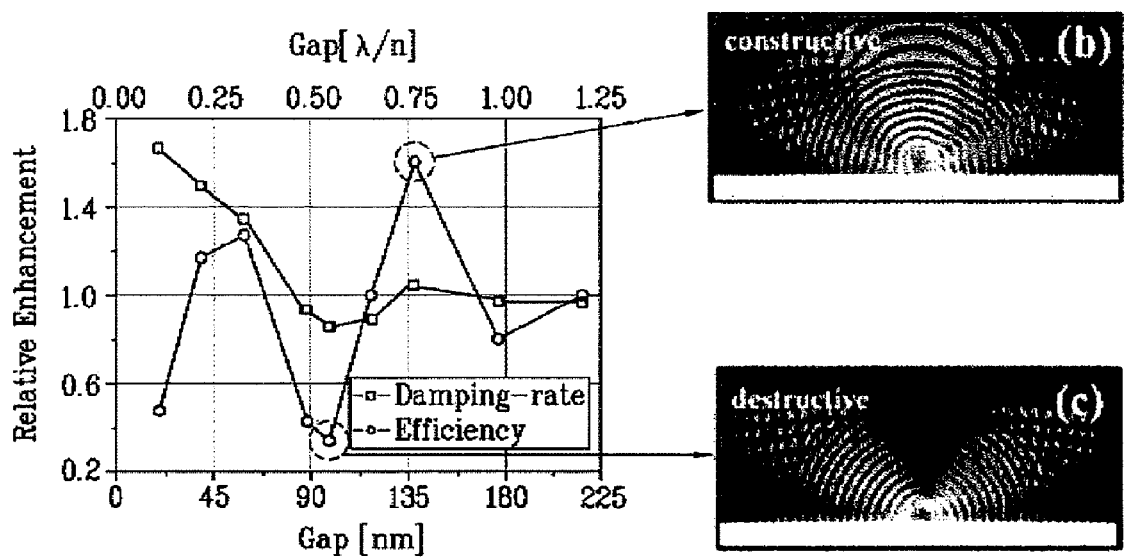

[Figure 3]
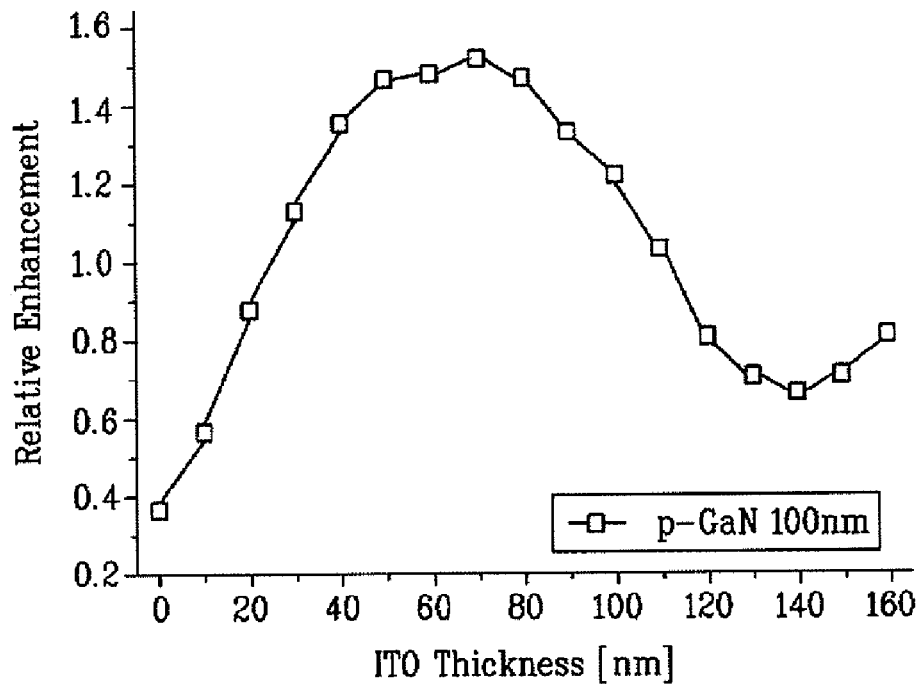
[Figure 4]
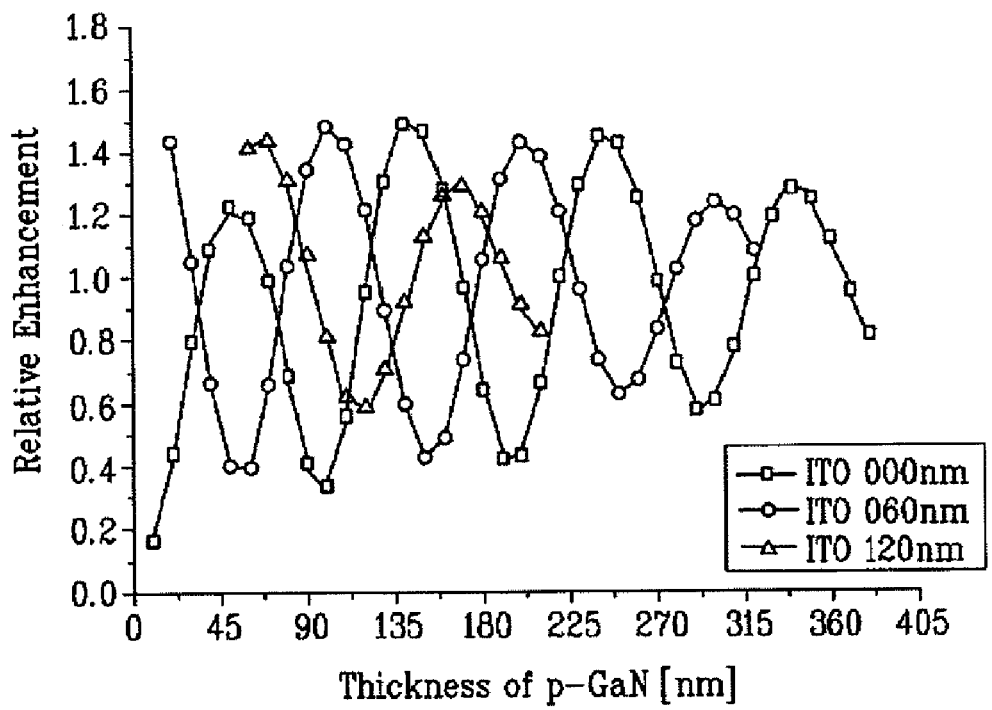

[Figure 5]
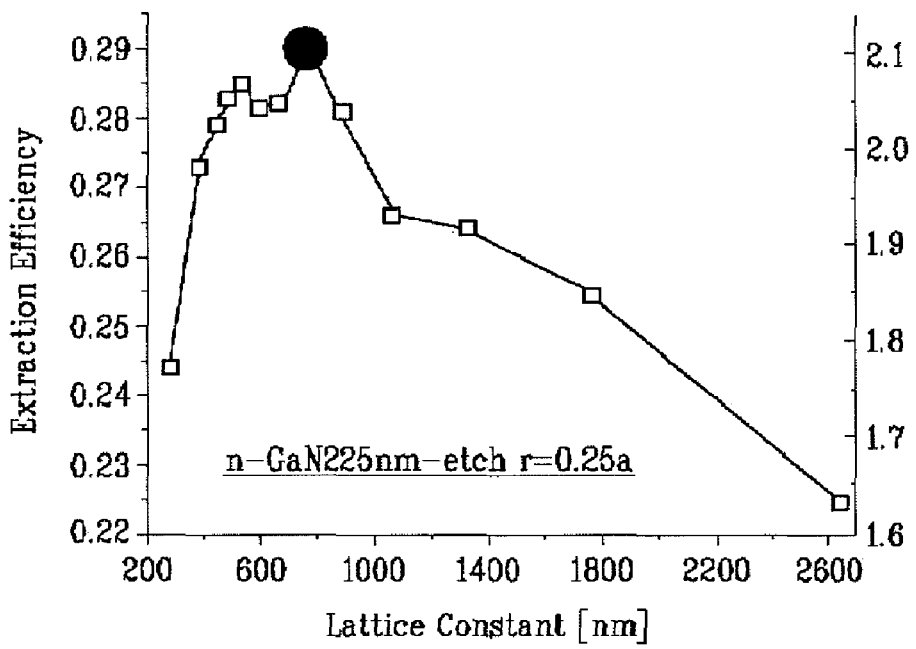
[Figure 6]
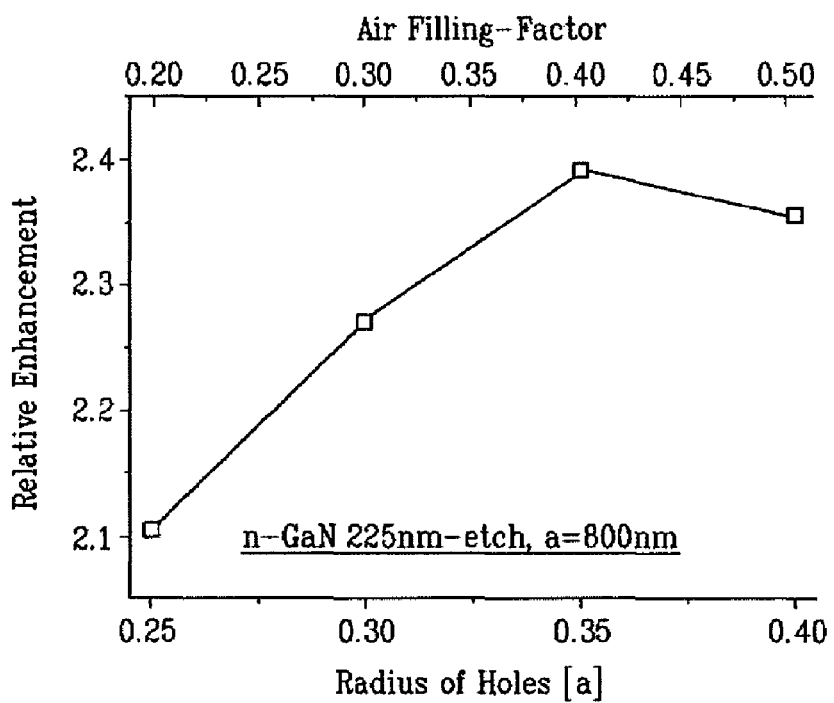

[Figure 7]
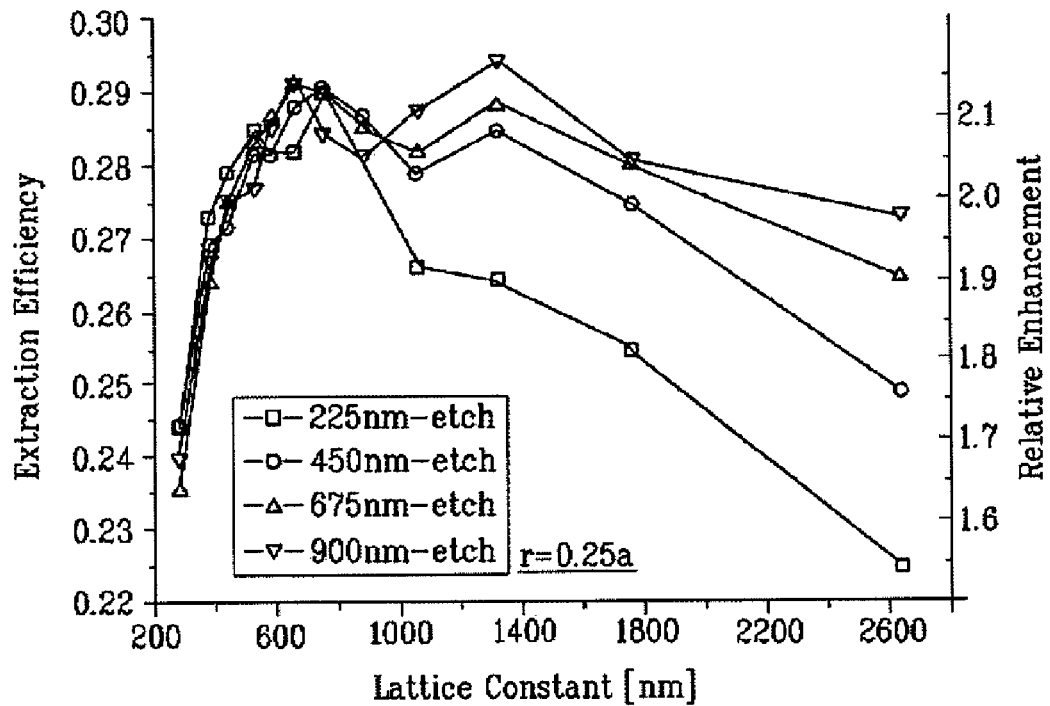
[Figure 8]
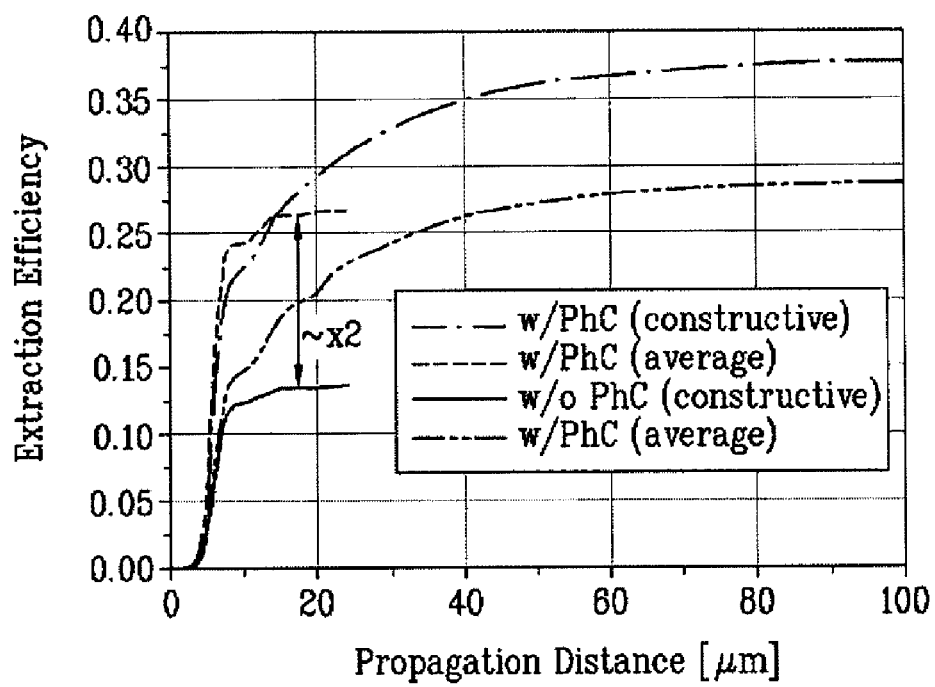

[Figure 9]
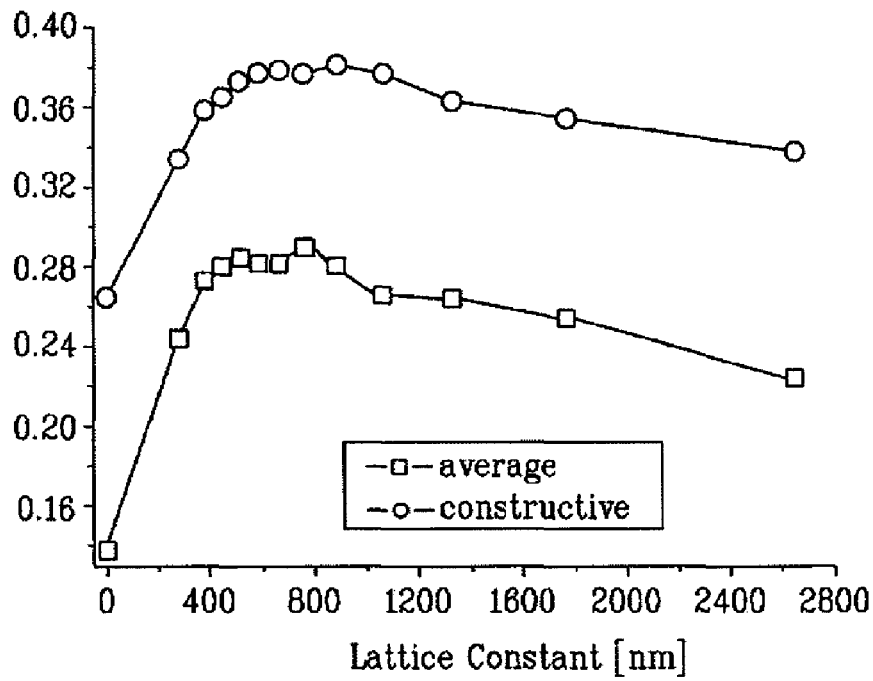
[Figure 10]
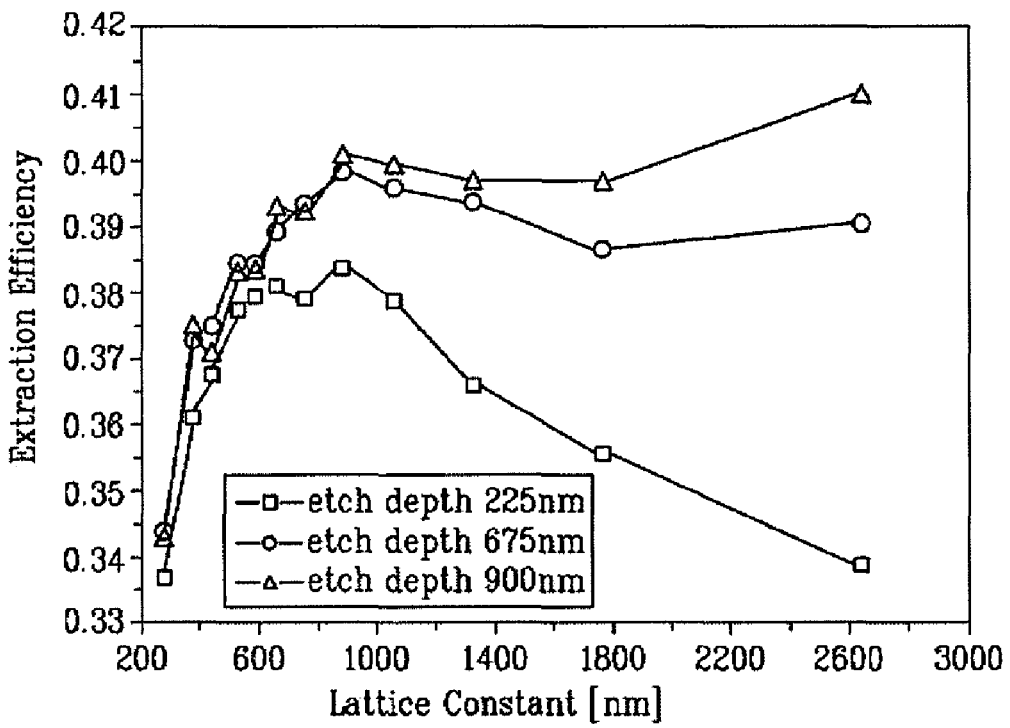

[Figure 11]
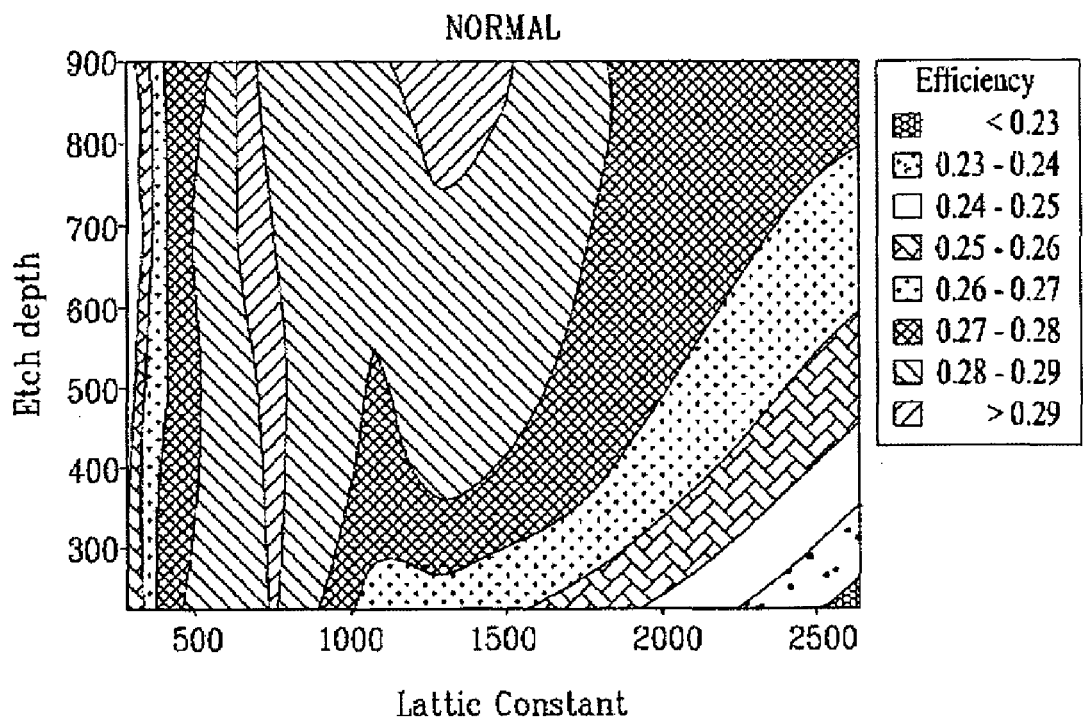
[Figure 12]
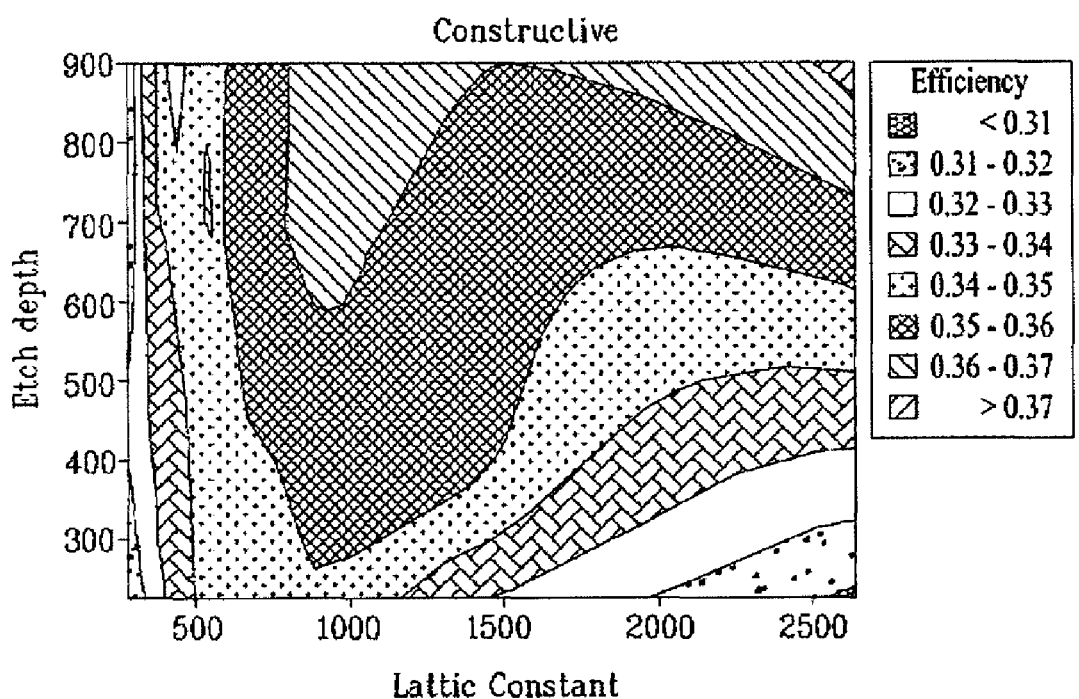

[Figure 13]
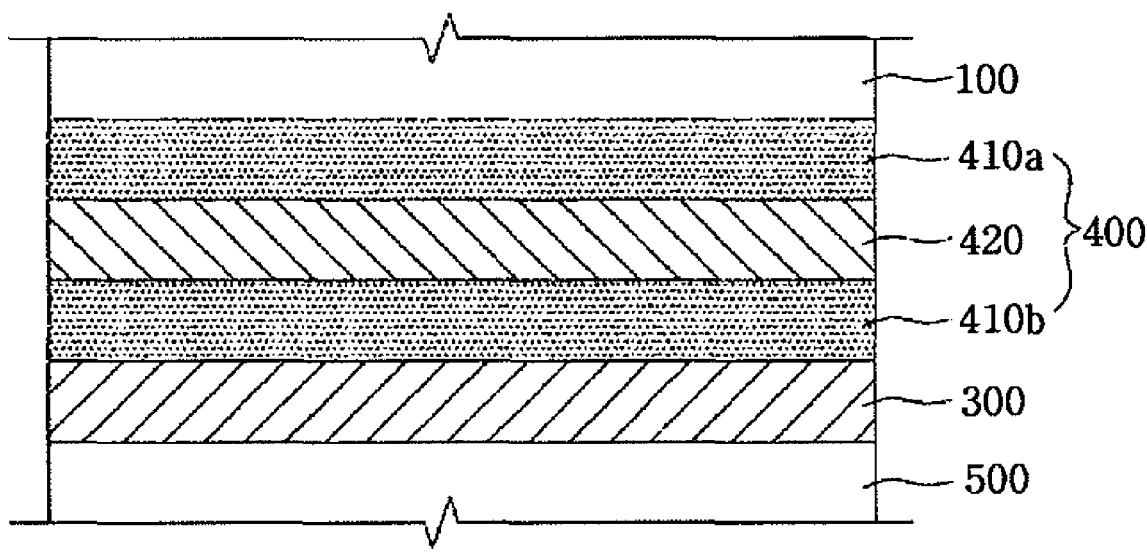
[Figure 14]
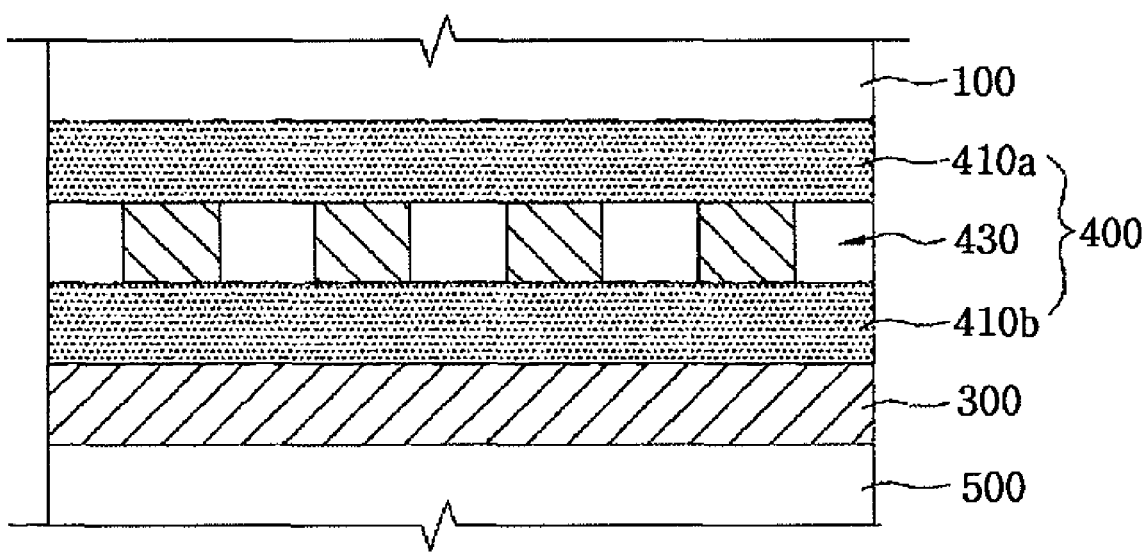

LIGHT EMITTING DEVICE

TECHNICAL FIELD

The present disclosure relates to a light emitting device.

BACKGROUND ART

Nitride semiconductors have been studied in the fields of optical and high-output electron device development because of their high thermal stability and wide bandgap. Currently, researches for a nitride semiconductor light emitting device are focused on light emitting efficiency improvement.

In order to realize a highly-efficient light emitting device, two methods are required in an aspect of a semiconductor thin film. One method is to increase light coupling probability of electrons and holes injected in a light emitting layer in order to improve internal quantum efficiency. The other method is to increase light extraction efficiency in order to allow light formed in a light emitting layer to escape from a thin layer effectively.

In order to improve internal quantum efficiency, a technique for growing a high-quality thin layer and a technique for optimizing a thin layer stacked structure to maximize quantum efficiency are required. In order to increase light extraction efficiency, various researches for controlling geometrical formation of a light emitting device are in progress.

DISCLOSURE

Technical Problem

Embodiments provide a light emitting device having an optimized light extraction efficiency.

Technical Solution

In one embodiment, a light emitting device comprises: a reflective layer; and a semiconductor layer comprising a light emitting layer on the reflective layer, wherein a distance between the reflective layer and a center of the light emitting layer corresponds to a constructive interference condition.

In another embodiment, a light emitting device comprises: a reflective layer; a dielectric layer on the reflective layer; a semiconductor layer comprises a first semiconductor layer, a light emitting layer, and a second semiconductor layer, on the dielectric layer, wherein a distance between the reflective layer and a center of the light emitting layer satisfies $(2m+1)/4 \times (\lambda/n) \pm \alpha$, where m is an integer equal to or greater than 0, $\lambda$ is a wavelength of emitted light, n is an average refractive index of a medium between the light emitting layer and the reflective layer, and $\alpha$ is a fluctuation range according to kinds of the reflective layer $(\alpha \langle (1/8) \times (\lambda/n))$.

Advantageous Effects

A light emitting device according to an embodiment obtains extraction efficiency improvement and output orientation by adjusting a distance between a reflective layer and a light emitting layer. The adjusting of the distance can be effectively accomplished through deposition of a semiconductor layer and a dielectric layer.

Additionally, when a conductive oxide layer is introduced as a dielectric layer, since a distance between a reflective layer and a light emitting layer can be adjusted by controlling a thickness of a dielectric layer during a deposition process, it is convenient to set the distance corresponding to the optimized light extraction efficiency.

Moreover, a light emitting device according to an embodiment improves light extraction efficiency by forming a Photonic Crystal (PhC) structure as a light extraction structure, and also moves the optimum period at which light extraction efficiency is maximized, into a long period region, by adjusting an etching depth of the photonic crystal structure.

DESCRIPTION OF DRAWINGS

FIG. 1 is a cross-sectional view of a light emitting device according to an embodiment.

FIG. 2 is a view illustrating an increase rate of light extraction efficiency according to an interval between a reflective layer and a light emitting layer and a radiation pattern according thereto.

FIG. 3 is a graph illustrating a change of light extraction efficiency according to the thickness of an ohmic electrode in an embodiment.

FIG. 4 is a graph illustrating a change of light extraction efficiency according to the thickness of a p-type semiconductor layer in an embodiment.

FIG. 5 illustrates a graph where extraction efficiency is changed according to a photonic crystal period.

FIG. 6 illustrates a change of extraction efficiency according to the size of the hole constituting the photonic crystal.

FIG. 7 is a graph illustrating a change of light extraction efficiency according to an etching depth of a photonic crystal structure in an embodiment.

FIGS. 8 and 9 are graphs illustrating effects according to a photonic crystal introduction in a structure having a constructive interference condition in an embodiment.

FIGS. 10 to 12 are graphs illustrating a change of extraction efficiency according to an etching depth of a photonic crystal structure in an embodiment.

FIGS. 13 and 14 are sectional views of a light emitting device including a dielectric layer of another embodiment.

BEST MODE

In the description of embodiments, it will be understood that when a layer (or film), region, pattern or structure is referred to as being 'on/over' another layer (or film), region, pad or pattern, the terminology of 'on/over' and 'under' includes both the meanings of 'directly' and 'indirectly'. Further, the reference about 'on/over' and 'under' each layer will be made on the basis of drawings.

In the drawings, the thickness or size of each layer is exaggerated, omitted, or schematically illustrated for convenience in description and clarity. Also, the size of each element does not entirely reflect an actual size.

FIG. 1 is a cross-sectional view of a light emitting device according to an embodiment.

The light emitting device according to an embodiment can include a reflective layer 300 and a semiconductor layer 100. The semiconductor layer 100 includes a light emitting layer 120 above the reflective layer 300. A distance d between the reflective layer 300 and the center of the light emitting layer 120 can correspond to a constructive interference condition.

FIG. 1 illustrates one example of a vertical light emitting device capable of maximizing light extraction efficiency. According to a structure of the light emitting device, the reflective layer 300 can be disposed on a supporting layer 500, a dielectric layer 400 such as a transparent conductive oxide can be disposed on the reflective layer 300, and the semiconductor layer 100 can be disposed on the dielectric layer 400. Additionally, the semiconductor layer 100 can include a p-type semiconductor layer 130, the light emitting layer 120, and an n-type semiconductor layer 110. A photonic crystal (PhC) structure including hole 210 can be formed in the surface of the semiconductor layer 100, and an n-type electrode 600 can be formed on a region excluding the photonic crystal structure.

In the photonic crystal structure 200, a mask pattern (not shown) can be formed on the surface of the semiconductor layer 100, for example, the surface of the n-type semiconductor layer 110, and the hole 210 can be formed through a dry or wet etching process. As a result, the photonic crystal structure 200 can be formed.

When considering one example of the vertical light emitting device, the distance d between the center of the light emitting layer 120 and the reflective layer 300 can correspond to the total thickness of the p-type GaN semiconductor layer 130 and the dielectric layer 400. Accordingly, within a range where electrical characteristics do not deteriorate, the thickness of the p-type GaN semiconductor layer 130 and the dielectric layer 400 having a radiation pattern in a vertical direction needs to be selected.

This embodiment can include a non-conductive substrate or a conductive substrate. For example, the light emitting device can include an AlGaInP diode on a GaP substrate, a GaN diode on a SiC substrate, a SiC diode on a SiC substrate, a SiC diode on a sapphire substrate, etc.

Furthermore, the dielectric layer 400 can be a transparent conductive oxide. An Indium-Tin-Oxide (ITO) having a less reflective index than the semiconductor layer 100. Other materials such as an Indium-Zinc-Oxide (IZO), an Aluminum-Zinc-Oxide (AZO), a Magnesium-Zinc-Oxide (MZO), or a Gallium-Zinc-Oxide (GZO) can be used as the dielectric layer 400.

First Embodiment

The first embodiment can increase light extraction efficiency by adjusting a light emitting characteristic of the light emitting layer 120. For example, because of an interference effect between light generated in the light emitting layer 120 and light reflected from the reflective layer 300, an output radiation pattern can be adjusted.

That is, according to the first embodiment, if the reflective layer 300 is close to the light emitting layer 120 within a range where a radiation pattern can be adjusted, constructive interference occurrence in a vertical direction can be advantageous in terms of light extraction efficiency.

FIG. 2 is a view illustrating an increase rate of light extraction efficiency according to an interval between a reflective layer (e.g., a mirror) and a light emitting layer and a radiation pattern according thereto.

As shown in FIG. 2, according to the finite-difference time-domain (FDTD) computer simulation, an extraction efficiency increase rate due to an output pattern change and a decrease rate of the light emitting layer can be arithmetically calculated by adjusting the distance d between the reflective layer 300 and the light emitting layer 120. The reflective layer 300 can be assumed as a perfect mirror having reflexibility of 100%, and the thickness of the light emitting layer 120 can be set with about 12.5 nm.

First, while examining the result about the extraction efficiency increase rate, the maximum/minimum point of extraction efficiency can be shown by about a ¼ wavelength of light. This is evidence that a radiation pattern can be changed by an interference effect of light and extraction efficiency can be adjusted according thereto.

Actually, while examining a radiation pattern at the maximum point and the minimum point, when it is a case of the maximum point, strong emission occurs in a vertical direction. When it is a case of the minimum point, there is almost no light in the vertical direction and most of the light is emitted being slant at a specific angle greater than a critical angle.

The requirement for maximizing extraction efficiency can be when the interval between the light emitting layer 120 and the reflective layer 300 is about ¾ ($\lambda$/n), and extraction efficiency can be increased when the interval is one of odd multiples of about $\lambda$/4n.

On the other hand, as illustrated in FIG. 1, if the dielectric layer 400 exists between the p-type semiconductor layer 130 and the reflective layer 300, a situation can be changed.

This dielectric layer 400 can be constituted by an ITO layer serving as a current diffusion layer or a combination of ITO and a typical dielectric. The dielectric 400 can have a refractive index ranging from 1.8 to 2.0 in a case of the ITO layer. If the semiconductor layer 100 can be formed of GaN, its refractive index can be 2.4, which is greater than a refractive index of the dielectric layer 400.

FIG. 3 is a graph illustrating a change of light extraction efficiency according to the thickness of an ohmic electrode in an embodiment.

In FIG. 3, when it is assumed that the dielectric layer 400 is formed of ITO, the refractive index of the ITO can be 1.8, and the thickness of the p-type semiconductor layer 130 can be 100 nm, how extraction efficiency can be changed based on the thickness of ITO is illustrated. According to the result, when the thickness of ITO can reach about 80 nm, it is shown that the maximum extraction efficiency can be achieved.

The maximum value of extraction efficiency is up to about 1.5 times, which is almost identical regardless of introduction of the dielectric layer 400. On the contrary, it is understood that a physical distance d between the reflective layer 300 and the center of the light emitting layer 120 where the extraction efficiency is maximized can be increased after the dielectric layer 400 is introduced.

That is, if there is only the p-type semiconductor layer 130, the optimal distance is about 140 nm. If the dielectric layer 400 such as ITO is additionally introduced, the optimal distance can be about 180 nm, which is the total thickness of the p-type semiconductor layer 130 and the dielectric layer 400. However, if two conditions are converted in to an optical distance, it is understood that the converted optical distance satisfies ¾($\lambda$/n).

When considering above situations, the distance d between the reflective layer 300 and the center of the light emitting layer 120 can be $(2m+1)/4 \times (\lambda/n) \pm \alpha$. At this point, m is an integer equal to or greater than 0, $\lambda$ is a wavelength of emitted light, and n is an average refractive index of medium disposed between a light emitting layer and a reflective layer. additionally, $\alpha$ is a fluctuation range based on the kinds of the reflective layers, i.e., $\alpha \langle (\frac{1}{8}) \times (\lambda/n)$.

However, n is an average refractive index obtained by considering a refractive rate and a thickness of ITO constituting the p-type semiconductor layer 130 and the dielectric layer 400 not a refractive index of GaN constituting the p-type semiconductor layer 130.

As mentioned above, if the dielectric layer 400 having a low refractive index is disposed between the p-type semiconductor layer 130 and the reflective layer 130, an advantage of manufacturing processes are, as shown in the result of FIG. 3, is that the thickness interval of the dielectric layer 400, where extraction efficiency is maximized, can be broadly distributed.

In order to utilize a mirror interference effect, the distance between the reflective layer 300 (e.g., a mirror) and the light emitting layer 120 can be a very important factor. The thickness itself of the p-type semiconductor layer can be predetermined to meet the optimization of the growth condition.

However, if the ITO layer having a low refractive index is used as the dielectric layer 400, the requirement for maximizing interference effect can be easily accomplished during manufacturing processes. This is because the ITO layer can be applied through typical deposition equipment such as a sputter and its thickness can be accurately controlled.

FIG. 4 is a graph illustrating a change of light extraction efficiency according to the thickness of a p-type semiconductor layer in an embodiment.

FIG. 4 illustrates a change of light extraction efficiency according to the thickness of the p-type semiconductor layer 130 when there is no ITO layer, or its thickness is fixed with each of 60 nm and 120 nm. As shown in the result, as the thickness of the ITO layer can be increased, the thickness for maximizing extraction efficiency of the p-type semiconductor layer 130 becomes thinner. This means that extraction efficiency can become maximized when the sum of the optical thicknesses of the ITO layer and the p-type semiconductor layer 130 satisfies a specific value.

If interference effect by a reflective layer (e.g., a mirror) is to be actually applied to a vertical GaN light emitting device structure, requirements assumed for the computer simulation must be resolved. Especially, although the light emitting layer 120 is assumed as a point light source, the light emitting layer 120 including a quantum well layer of a light emitting device has a thickness of 50 nm to 100 nm according to the number of stacked pairs.

However, if the thickness of the light emitting layer 120 is more than $\lambda/2n$, interference effect by the mirror gradually disappears. Accordingly, while maintaining internal quantum efficiency, a growth technique for reducing the thickness of a quantum well is required. Accordingly, the maintaining of the thickness of the light emitting layer 120 below the half of $\lambda/n$ is advantageous.

Second Embodiment

The second embodiment comprises a photonic crystal structure to improve light extraction efficiency.

The second embodiment can adapt technical features of the first embodiment and distinctive contents will be described below.

A structural device capable of extracting light corresponding to a total reflection angle is necessarily required in order to improve light extraction efficiency of a light emitting device. A structure serving as the above-mentioned structure can be a light extraction structure such as a photonic crystal structure. The photonic crystal structure can be a structure having a section where permittivity is spatially changed with periodicity or aperiodicity.

The light extraction structure such as the photonic crystal structure in the second embodiment adds or subtracts a momentum component that its periodicity generates to or from the light of a total reflection angle where momentum can not be conserved, in order to help extract the result toward the outside.

FIG. 5 illustrates a graph where extraction efficiency is changed according to a photonic crystal period. The fact that there is an optimal period for maximizing light extraction efficiency disproves the evidence that extraction efficiency improvement through the photonic crystal is a diffraction process of light.

The light extraction efficiency by the photonic crystal has a close correlation with structural variables such as a pattern depth, a filling factor, and a photonic crystal lattice structure in addition to a period of the photonic crystal structure. The filling factor is an area that a unit structure constituting a pattern occupies. The lattice structure of the photonic crystal includes a rectangular lattice, a triangle lattice, and an Archimedean lattice. Besides that, various photonic crystal lattice structure such as random, quasicrystal, pseudorandom can be also applied.

As mentioned above, it is important to design and apply the optimized photonic crystal structure in order to improve extraction efficiency in a semiconductor light emitting device.

Hereinafter, processes for determining a structural factor of the photonic crystal applicable to the vertical GaN light emitting device through computer simulation and for producing an increase rate of relative extraction efficiency that can be obtained in each structural factor will be described.

Unlike a parallel structure, according to the vertical light emitting device structure, since there is no radiation through a substrate side, a total efficiency corresponds to the efficiency obtained through vertical radiation. As illustrated in FIG. 1, the structure of a light emitting device for an analysis based on a computer simulation can include a light emitting device semiconductor layer 100 having the photonic crystal 200. Additionally, a structure where an epoxy 700 used as a sealing material can be disposed on the outside of the photonic crystal 200 can be used.

The typical size of the light emitting device can not be included in a calculation structure due to a computer memory limitation. To resolve this limitation, a case where a perfect mirror (not shown) can be applied to both ends of a light emitting device having a limited size (e.g., about 12 μm) will be applied.

Additionally, an absorption rate (k=0.045) can be allowed in the light emitting layer 120 of the light emitting device 100. However, the bottom part of the structure can include a perfect mirror having reflexibility of 100% instead of an actual metal mirror having an absorption rate, for ease of interpretation.

Since the vertical-type structure must consider an interference effect by a mirror, i.e., a reflective layer, a relative position of the light emitting layer 120 with respect to the mirror in a structure becomes a very important variable. The reason is that if a radiation pattern is changed by an interference effect between the reflective layer 300 and the light emitting layer 120, a structural factor of the effectively operating photonic crystal 200 can be changed. That is, an angle of light where extraction can be effectively accomplished through a refraction process according to a period of the photonic crystal 200 can be changed.

Here, the effect caused by the photonic crystal 200 can be calculated in a state where the mirror effect is excluded. In order to exclude interference effect of the mirror, the distance between the mirror and the light emitting layer 120 can be set to be increased or can be set to be the middle point of the constructive interference condition and the destructive interference condition.

Likewise, when the light emitting layer 120 is free from an interference effect of the mirror, there are still fine interference patterns in the radiation pattern but it is possible that the fine interference pattern is regarded as a spherical wave.

While examining an extraction efficiency change with respect to the photonic crystal 200, as illustrated in FIG. 5, the period of the photonic crystal 200, where the maximum extraction efficiency can be obtained, is around about 800 nm, and a relative increase rate of the extraction efficiency can be about two times. The etching depth can be fixed with about 225 nm and the radius of the hole 210, constituting the photonic crystal, can be fixed with about 0.25a.

FIG. 6 illustrates a change of extraction efficiency according to the size of the hole 210 constituting the photonic crystal 200. The etching depth can be fixed with 225 nm and a period can be selected with 800 nm. Looking at the results, when the size of the hole 210 of the photonic crystal 200 can be 3.25a, extraction efficiency is maximized and a relative increase rate can be increased up to about 2.4 times.

As mentioned above, advantages of the vertical-type GaN light emitting device is less limited to the etching depth. The maximum etching depth of the parallel structure can be determined by the thickness (in reality, about the half of thickness of the p-type GaN layer by considering a resistance increase) of the p-type GaN semiconductor layer, but the vertical type structure can utilize the thickness (about 3 μm) of the n-type GaN semiconductor layer having a relatively thicker thickness.

FIG. 7 is a graph illustrating a change of light extraction efficiency according to an etching depth of a photonic crystal structure in an embodiment.

In order to utilize advantages of the vertical-type structure, as illustrated in FIG. 8, an etching depth for forming a photonic crystal can be sequentially changed and then the optimal period according to this etching depth is examined.

As mentioned in a parallel structure study, it tends to appear that extraction efficiency is saturated with respect to an etching depth having a more than predetermined level.

On the other hand, as the etching depth of the photonic crystal structure in the second embodiment can be deeper, extraction efficiency by the photonic crystal structure of a long period can be steadily increased. This is a very remarkable point because the photonic crystal structure having a long period, which is technically realizable without difficulties, can be utilized when the etching depth is deep.

The reason that extraction efficiency of the photonic crystal structure with a long period is continuously increased as the etching depth is increased is as follows.

First, in order to allow light to pass through two mediums having different refractive indices, a phase-matching condition of a plane direction needs to be satisfied. Second, when light progresses from a medium having a high refractive index to a medium having a low refractive index, a phase-matching condition cannot be satisfied at more than a specific angle. This specific angle is called a critical angle, and total reflection occurs at an angle higher than the critical angle.

Third, the photonic crystal helps light corresponding to a total reflection angle to be extracted toward the outside. That is, once the photonic crystal and light are combined, momentum of the photonic crystal is added such that the light corresponding to a total reflection can satisfy a phase-matching condition. Forth, the momentum of photonic crystal is inversely proportional to the period. That is, since the photonic crystal having a short period can make a large momentum, among lights corresponding to the total reflection, the light progressing close to the parallel direction far from the critical angle can be effectively extracted. On the contrary, the photonic crystal having a long period is effective to extract the progressing light that is relatively close to the vertical direction.

Fifth, according to the undulatory wave theory, a total reflection process in a waveguide structure can be explained corresponding to a mode. For example, the light having an incident angle close to a parallel direction corresponds to a basic waveguide mode, and the light having an incident angle close to a vertical direction corresponds to a high degree mode. Sixth, the GaN light emitting device can be regarded as a waveguide structure having a thickness of more than several microns.

Accordingly, when the photonic crystal is applied to the GaN light emitting device by considering the above fact, the photonic crystal having a short period is appropriate for extracting a basic waveguide mode, and the photonic crystal having a long period is appropriate for extracting a high degree waveguide mode.

In general, according to the basic waveguide mode, it has tendency that extraction efficiency is saturated with respect to the photonic crystal etching depth ($\sim\lambda/n$) of more than a predetermined degree. On the contrary, as it becomes toward the high degree mode, it has tendency that extraction efficiency with respect to the photonic crystal etching depth is steadily increased.

As a result, as the etching depth is increased, extraction efficiency is continuously increased in a high degree mode using a photonic crystal structure having a long period.

As mentioned above, in order to maximize the extraction efficiency, an optimization process of the photonic crystal structural factor is accomplished through a computer simulation. The extraction efficiency can have a close correlation with the etching depth, the hole size, and the period.

Especially, in a case of the vertical-type GaN light emitting device, since a relatively thick n-type GaN semiconductor layer is used in the photonic crystal formation, there is no limitation in the etching depth actually, and when the deep etching depth is introduced like above, there is more possibility that the period within a range that is easily realizable through a typical technique is selected.

FIGS. 8 and 9 are graphs illustrating effects according to a photonic crystal introduction in a structure having a constructive interference condition in an embodiment.

Hereinafter, effect of the photonic crystal structure when the distance d between the reflective layer 300 (i.e., the mirror) and the center of the light emitting layer 120 is in a constructive interference condition will be described. According to the constructive interference condition, when an opening can be about $\frac{3}{4}(\lambda/n)$, a relatively large amount of light progresses in a vertical direction.

FIG. 8 illustrates the degree of extraction efficiency improvement when this condition is applied to the photonic crystal structure.

First, according to a structure to which the photonic crystal is not applied, the constructive interference condition shows extraction efficiency improvement of about two times compared to the spherical wave condition having almost no mirror effect. The reason that this value is greater than a value of when interference effect of the mirror is calculated (1.6 times increase) is that this structure considers an absorption rate.

When examining the graph with the photonic crystal structure (period=about 800 nm, etching depth=about 225 nm), a structure to which the constructive interference condition is applied shows the most excellent characteristic.

However, the relative increase rate before/after the photonic crystal is about 1.2 times at the maximum. The reason is that the light generated in the light emitting layer is mostly included within a critical angle first such that an amount of light extracted through the photonic crystal is reduced by that much.

Next, FIG. 9 illustrates a change of extraction efficiency according to a photonic crystal period with respect to a constructive interference condition. The etching depth of the photonic crystal can be fixed with 225 nm, and the size of the hole constituting the photonic crystal can be 0.25a. In order to examine efficiency dependency with respect to the periods of the constructive interference condition and normal condition, two results are shown in one graph.

While examining the result, the optimal period for the constructive interference condition and the optimal period for the normal condition have no great difference, and the optimal period can be formed around about 800 nm.

FIGS. 10 to 12 are graphs illustrating a change of extraction efficiency according to an etching depth of a photonic crystal structure in an embodiment.

Hereinafter, referring to FIG. 10, an extraction efficiency change according to the etching depth of the photonic crystal will be described.

In a case of the normal condition where an output pattern of the light emitting layer is assumed as a spherical wave, it is divided into a period where extraction efficiency is saturated with respect to the etching depth and a period where extraction efficiency is continuously increased in proportion to the etching depth, by using the period of about 1 μm as a reference period.

The reason is that as the period of the photonic crystal is increased, the total reflection light close to a critical angle is easily refracted. If this principle is applied to the currently discussed constructive interference condition, since radiation of the vertical direction center starts at the beginning under this condition, it is expected that the role of the photonic crystal having a long period becomes more important.

To verify this effect, extraction efficiency with respect to a period is calculated with variation of an etching depth by using the computer simulation as illustrated in FIGS. 10 to 12. If compared to the normal condition, as the etching depth is increased, the optimal period where the extraction efficiency is maximized moves toward the long direction clearly.

For example, if the etching depth is 900 nm, the optimal period is more than 2 μm. This corresponds to a structure that can be manufactured using resolution of a current photolithography. Thus, it is very significant in terms of practicality.

One example of a structure of a light emitting device where light extraction efficiency is maximized has the same structure as FIG. 1.

That is, the light emitting device includes a reflective layer 300 on a supporting layer 500, a dielectric layer 400 such as a transparent conductive oxide on the reflective layer 300, a p-type semiconductor layer 100 on the dielectric layer 400, a light emitting layer 120, and an n-type semiconductor layer 110. The dielectric layer 400 can be formed of a material that can be used for ohmic-contacting the p-type semiconductor layer, and a transparent conductive oxide can be used as the dielectric layer 400.

A photonic crystal 200 formed by a plurality of hole patterns or pillar structures can be disposed on the n-type semiconductor layer 110, and an n-type electrode 600 can be partially disposed on the n-type semiconductor layer 110. As illustrated, a photonic crystal pattern can not be formed on the portion where the n-type electrode 600 is disposed.

In the photonic crystal 200, the depth of the hole 210 or the height of a pillar structure can range from 300 nm to 3,000 nm, and a period of the photonic crystal 200 or an average period can range from 0.7 μm to 5 μm. That is, the photonic crystal 200 can have a regular pattern, or a pseudo-random pattern having an average period. The size (diameter) of the hole 210 or the pillar structure can range from 0.25 to 0.45 a when the period is a.

As mentioned above, the distance d between the reflective layer 300 and the center of the light emitting layer 120 can be an odd multiple of about $\lambda/4n$.

The adjusting of the distance d between the reflective layer 300 and the center of the light emitting layer 120 can be accomplished by the semiconductor layer 130 and the dielectric layer 400. That is, the constructive interference condition can be obtained during light extraction by adjusting the distance d between the reflective layer 300 and the center of the light emitting layer 120.

Likewise, light extraction efficiency can be more easily controlled by adjusting the thickness of the transparent dielectric layer 400. That is, the constructive interference condition of the light extraction can be more easily controlled by adjusting the thickness of the dielectric layer 400.

The reflectivity of the reflective layer 300 is advantageous when it is more than 50%, and can include any one of Ag, Pt, and Al.

FIGS. 13 and 14 are sectional views of a light emitting device including a dielectric layer of another embodiment.

As illustrated in FIG. 13, the dielectric layer 400 can include an intermediate layer 420 between upper and lower transparent conductive oxide layers 410a and 410b. The intermediate layer 420 is formed of an oxide such as $SiO_2$, $TiO_2$ or a nitride such as $Si_3N_4$.

Additionally, as illustrated in FIG. 14, the intermediate layer 430 formed of the oxide or nitride constitutes a specific pattern. This specific pattern can be identical or similar to the above-mentioned photonic crystal pattern. Space between the intermediate layer patterns can be filled with a transparent conductive oxide or remains empty.

According to the present invention, when the photonic crystal 300 can be introduced in the n-type semiconductor layer 110 of the vertical GaN light emitting device in order to improve external light extraction efficiency, by utilizing an interference effect and an etching depth of the reflective electrode 300, the maximum extraction efficiency can be accomplished in the photonic crystal 200 of a easily manufactured long period (more than 1 μm). Additionally, only using the interference effect of the reflective layer 300, extraction efficiency can be improved.

INDUSTRIAL APPLICABILITY

As mentioned above, when a structure of a light emitting device includes a package, the light emitting device can obtain high extraction efficiency regardless of a package structure.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

The invention claimed is:

1. A light emitting device, comprising:
a reflective layer;
an ohmic contact layer on the reflective layer;

a p-type semiconductor layer on the ohmic contact layer;
an active layer on the p-type semiconductor layer; and
an n-type semiconductor layer on the active layer,
wherein a distance "d" between the reflective layer and a light emitting portion of the active layer is set to the following equation:
d=(2m+1)/4×(λ/n)±α, where m is an integer equal to or greater than 0, λ is a wavelength of light emitted by the active layer, n is an average refractive index of a medium including the p-type semiconductor layer and the ohmic contact layer between the active layer and the reflective layer, and α is a fluctuation range according to types of the reflective layer where α⟨(⅛)×(λ/n), and
wherein the ohmic contact layer comprises:
a lower transparent conductive oxide layer on the reflective layer;
an intermediate dielectric layer on the lower transparent conductive oxide layer; and
an upper transparent conductive oxide layer on the intermediate layer.

2. The light emitting device according to claim 1, wherein the reflective layer comprises at least one of Ag, Pt, and/or Al.

3. The light emitting device according to claim 1, wherein the intermediate dielectric layer comprises a dielectric pattern.

4. The light emitting device according to claim 1, wherein a thickness of the active layer is less than (½)×(λ/n).

5. The light emitting device according to claim 3, further comprising:
a photonic crystal structure on the n-type semiconductor layer,
wherein the dielectric pattern is identical or similar to a pattern of the photonic crystal structure.

6. The light emitting device according to claim 5, wherein a depth of the photonic crystal structure is more than (λ/n).

7. The light emitting device according to claim 5, wherein a depth of a hole or a height of a pillar structure in the photonic crystal structure is within 300 nm to 3,000 nm, and an average period of the photonic crystal is within 0.7 μm to 5 μm.

8. The light emitting device according to claim 1, wherein the light emitting portion is a center of the active layer.

9. The light emitting device according to claim 3, wherein a space between the dielectric patterns is filled with a second transparent conductive oxide or remains empty.

10. A light emitting device comprising:
a reflective layer;
an ohmic contact layer on the reflective layer;
a second semiconductor layer on the ohmic contact layer;
an active layer on the second semiconductor layer; and
a first semiconductor layer on the active layer,
wherein a distance "d" between the reflective layer and a light emitting portion of the active layer is set to the following equation:
d=(2m+1)/4×(λ/n)±α, where m is an integer equal to or greater than 0, λ is a wavelength of light emitted by the active layer, n is an average refractive index of a medium including the second semiconductor layer and the ohmic contact layer between the active layer and the reflective layer, and α is a fluctuation range according to types of the reflective layer where α⟨(⅛)×(λ/n), and
wherein the ohmic contact layer comprises:
a lower transparent conductive oxide layer on the reflective layer;
an intermediate dielectric layer on the lower transparent conductive oxide layer; and
an upper transparent conductive oxide layer on the intermediate layer.

11. The light emitting device according to claim 10, wherein the second semiconductor layer is a p-type semiconductor layer and the first semiconductor layer is an n-type semiconductor layer.

12. The light emitting device according to claim 10, wherein the reflective layer comprises at least one of Ag, Pt, and/or Al.

13. The light emitting device according to claim 10, wherein the intermediate dielectric layer comprises a dielectric pattern.

14. The light emitting device according to claim 10, wherein a thickness of the active layer is less than (½)×(λ/n).

15. The light emitting device according to claim 10, further comprising:
a photonic crystal structure on the first semiconductor layer,
wherein the dielectric pattern is identical or similar to a pattern of the photonic crystal structure.

16. The light emitting device according to claim 15, wherein a depth of the photonic crystal structure is more than (λ/n).

17. The light emitting device according to claim 15, wherein a depth of a hole or a height of a pillar structure in the photonic crystal structure is within 300 nm to 3,000 nm, and an average period of the photonic crystal is within 0.7 μm to 5 μm.

18. The light emitting device according to claim 10, wherein the light emitting portion is a center of the active layer.

19. The light emitting device according to claim 13, wherein a space between the dielectric patterns is filled with a second transparent conductive oxide or remains empty.

* * * * *